(12) United States Patent
Reinmuth et al.

(10) Patent No.: US 11,897,758 B2
(45) Date of Patent: Feb. 13, 2024

(54) ELECTRICAL CONTACTING AND METHOD FOR PRODUCING AN ELECTRICAL CONTACTING

(71) Applicant: Robert Bosch GmbH, Stuttgart (DE)

(72) Inventors: Jochen Reinmuth, Reutlingen (DE); Markus Kuhnke, Wannweil (DE); Stefan Majoni, Weil Im Schoenbuch (DE); Timo Schary, Aichtal-Neuenhaus (DE)

(73) Assignee: ROBERT BOSCH GMBH, Stuttgart (DE)

( * ) Notice: Subject to any disclaimer, the term of this patent is extended or adjusted under 35 U.S.C. 154(b) by 322 days.

(21) Appl. No.: 17/252,044

(22) PCT Filed: Jun. 25, 2019

(86) PCT No.: PCT/EP2019/066921
§ 371 (c)(1),
(2) Date: Dec. 14, 2020

(87) PCT Pub. No.: WO2020/002385
PCT Pub. Date: Jan. 2, 2020

(65) Prior Publication Data
US 2021/0261404 A1    Aug. 26, 2021

(30) Foreign Application Priority Data
Jun. 30, 2018    (DE) .......................... 102018210815.3

(51) Int. Cl.
*B81B 7/00*    (2006.01)
*B81C 1/00*    (2006.01)

(52) U.S. Cl.
CPC .......... *B81B 7/007* (2013.01); *B81C 1/00301* (2013.01); *B81B 2207/092* (2013.01); *B81B 2207/095* (2013.01)

(58) Field of Classification Search
CPC .............. B81B 7/007; B81B 2207/092; B81B 2207/095; B81C 1/00301
See application file for complete search history.

(56) References Cited

U.S. PATENT DOCUMENTS

2010/0176466 A1    7/2010    Fujii et al.
2011/0146687 A1    6/2011    Fukushima
(Continued)

FOREIGN PATENT DOCUMENTS

TW    200406812 A    5/2004
TW    200908070 A    2/2009
(Continued)

OTHER PUBLICATIONS

International Search Report for PCT/EP2019/066921, dated Oct. 16, 2019.

*Primary Examiner* — Samuel A Gebremariam
(74) *Attorney, Agent, or Firm* — NORTON ROSE FULBRIGHT US LLP; Gerard A. Messina

(57) ABSTRACT

An electrical contacting between a surrounding wiring and a conductor region. The conductor region is situated in a conductor layer above an SOI wafer or SOI chip. A cover layer is situated above the conductor layer and below the surrounding wiring. The cover layer has a contacting region. The contacting region is insulated from the rest of the cover layer by a first configuration of recesses. An opening is formed at least in the contacting region. A metallic material is situated in the opening. The metallic material connects the surrounding wiring and the conductor region.

15 Claims, 8 Drawing Sheets

(56) References Cited

U.S. PATENT DOCUMENTS

| | | |
|---|---|---|
| 2011/0147859 A1 | 6/2011 | Tanaka et al. |
| 2014/0054730 A1* | 2/2014 | Graham .............. B81C 1/00015 |
| | | 257/415 |
| 2014/0117469 A1 | 5/2014 | Takahashi et al. |
| 2016/0167958 A1 | 6/2016 | Shkel et al. |
| 2018/0127268 A1* | 5/2018 | Fukumitsu ........... H03H 9/1057 |

FOREIGN PATENT DOCUMENTS

| | | |
|---|---|---|
| TW | 201205758 A | 2/2012 |
| WO | 2018117485 A1 | 6/2018 |

* cited by examiner

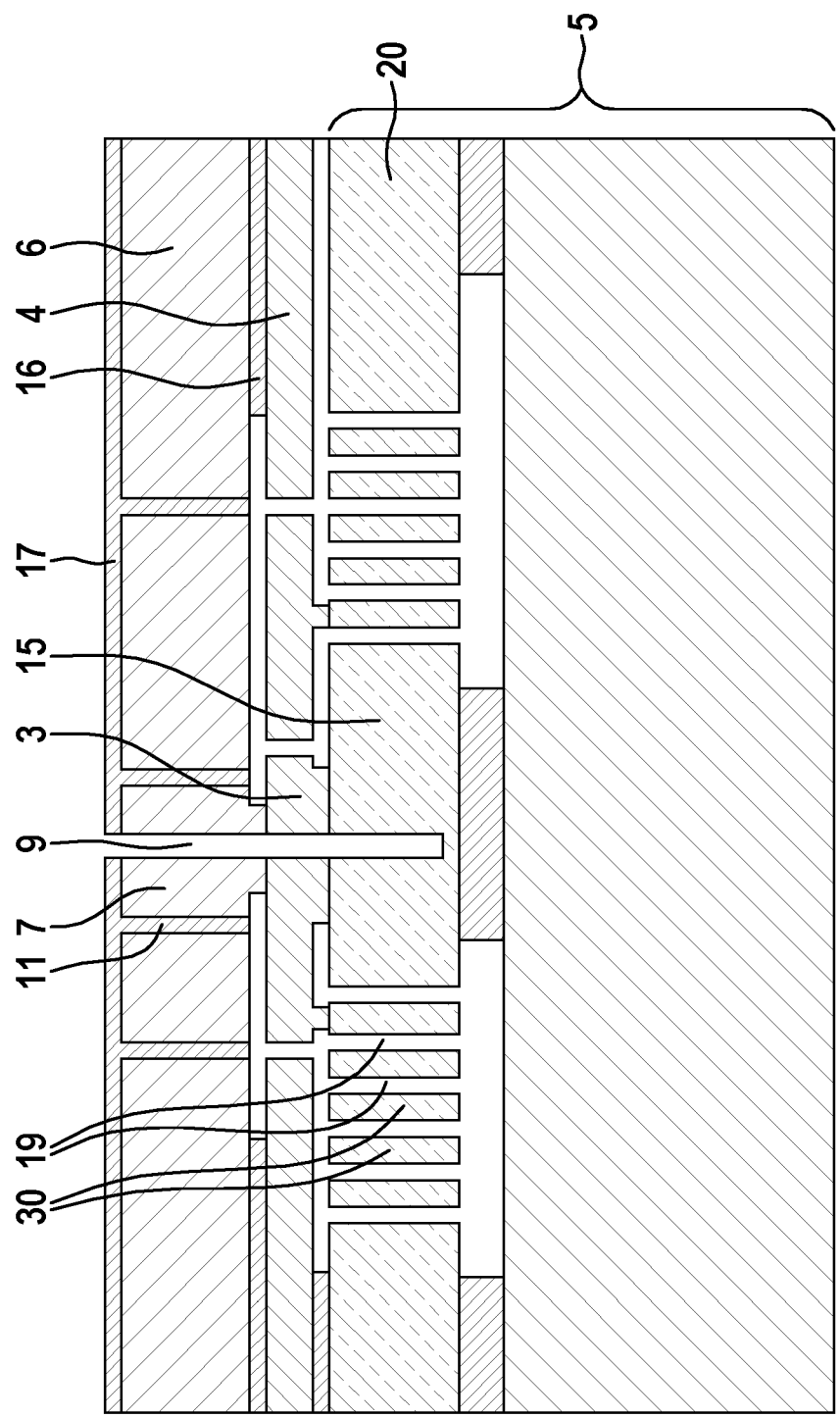

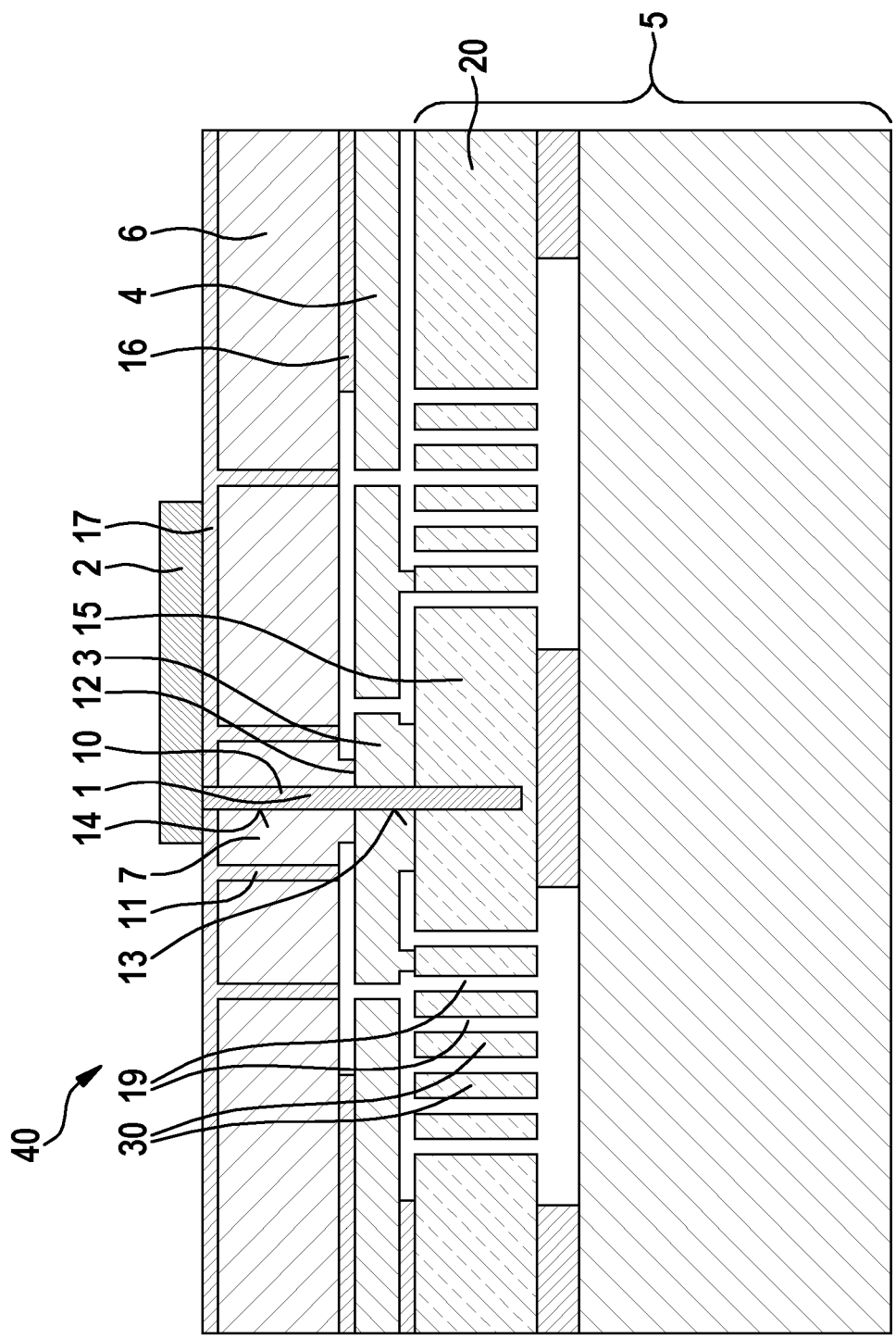

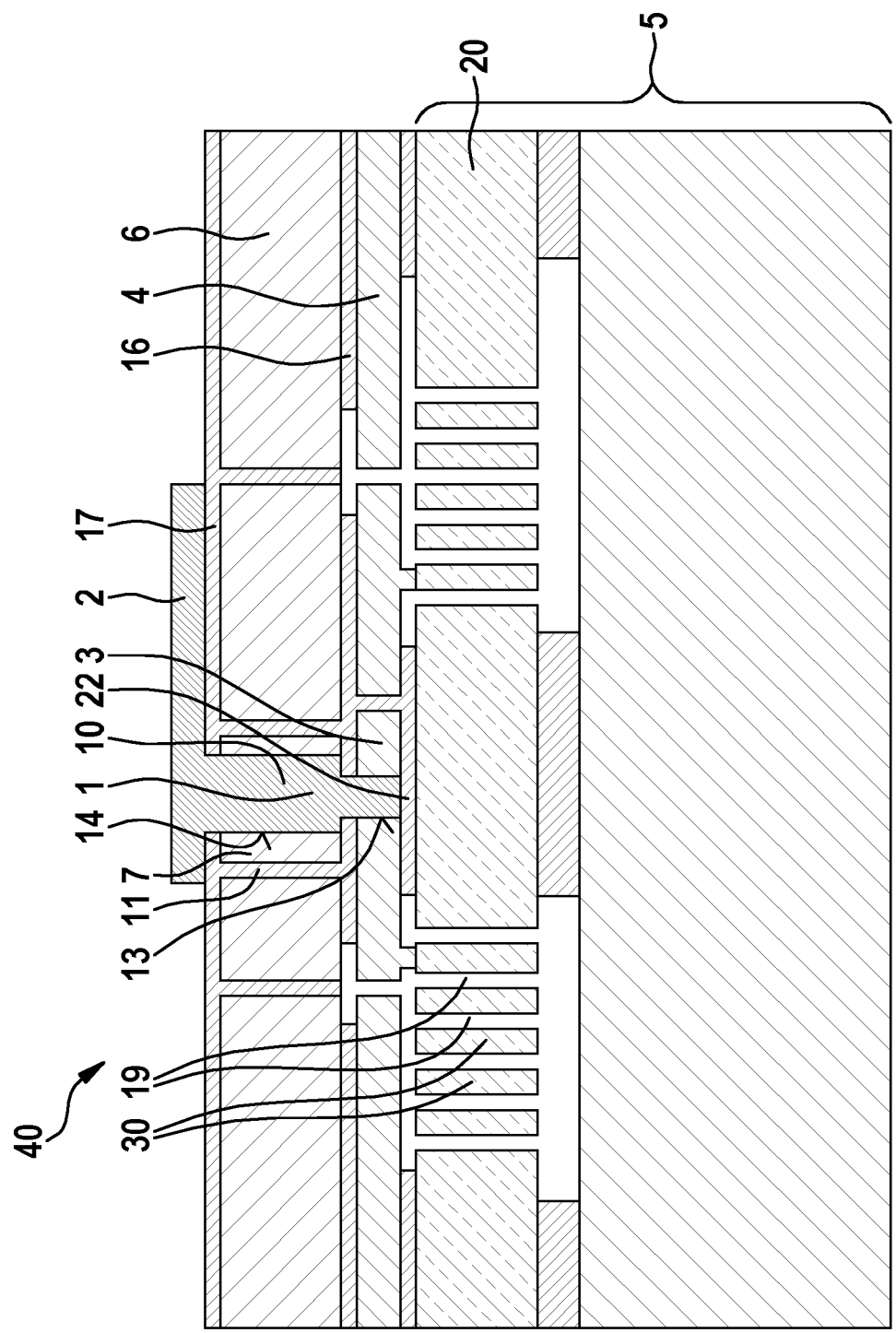

ELECTRICAL CONTACTING AND METHOD FOR PRODUCING AN ELECTRICAL CONTACTING

FIELD

The present invention relates to an electrical contacting between a surrounding wiring and a conductor region, the conductor region being situated in a conductor layer above an SOI wafer or SOI chip, a cover layer being situated above the conductor layer and below the surrounding wiring. In addition, the present invention relates to a method for producing an electrical contacting and to a system including an electrical contacting.

BACKGROUND INFORMATION

Electrical contactings, in particular through-silicon vias (TSVs), are generally conventional. Such contactings may pass through a wafer, or through only a partial region of a wafer. Typically, it is sought to achieve vias that are as small as possible, while at the same time also having a low volume resistance. In order to realize this, often narrow holes having nearly vertical walls are produced in a wafer, for example by trench processes or using a laser.

An insulation is then deposited in the holes. In a region on the floor of the hole, a contact etching is made through the insulation down to a conductor situated under it. The hole is then completely or partly filled with a conductive material or a stop/barrier and a conductive layer. The conductive material can be selected such that a low resistance is achieved. Overall, the insulation, and later the conductive material, are thus introduced into the same previously produced hole.

However, for many systems, such as microelectromechanical parts, such conventional TSVs cannot be produced or can be produced only with a very high outlay and associated costs, inter alia because in conventional methods, additional etch stop layers are required.

Correspondingly, for micromechanical elements, a different approach is usually taken, and the TSVs are made of doped silicon. However, such TSVs have a comparatively high electrical resistance. High-frequency applications are therefore not possible, or are possible only if losses of quality are accepted.

SUMMARY

An object of the present invention is to provide an electrical contacting between a surrounding wiring and a conductor region that can be used in a versatile manner, in particular for microelectromechanical systems, has a high conductivity, and preferably can be produced with moderate outlay and comparatively low process costs.

The electrical contacting according to the present invention between a surrounding wiring and a conductor region, the conductor region being situated in a conductor layer above an SOI wafer or SOI chip, has, in comparison with the related art, the advantage that the functional steps of the insulation of the contacting (in particular using the first configuration of recesses, which insulates the contacting region of the cover layer from the rest of the cover layer) and the situating of the metallic material can be carried out separately. In this way, additional etch stop layers between the cover layer and the conductor layer (in particular in the contacting region) can be omitted. Thus, according to the present invention. it is possible to provide a cost-saving electrical contacting that has a high electrical conductivity.

For example, in this way particular advantages can be achieved for applications in microelectromechanical elements in the high-frequency range. With a TSV that has no metallic material (having high conductivity) within the contact region in the cover layer, such advantages would in contrast not be achievable. Likewise, such advantages (low costs and flexible usability) would not be achievable with a system or process in which an insulator, and later a metal, are situated in the same previously produced hole one after the other.

According to the present invention, the terms "above" and "below" relate to a distance from the surface of an SOI wafer or chip. For example, the cover layer situated above the conductor layer and below the surrounding wiring is thus further from the surface of the SOI wafer (or of the SOI chip) than the conductor layer is, and is less far from the surface of the SOI wafer (or SOI chip) than the surrounding wiring is.

Advantageous developments and specific embodiments of the present invention are described herein.

Due to the fact that the opening is in addition made in the conductor region, the metallic material in addition being made in the opening in the conductor region, according to a specific embodiment of the present invention it is advantageously possible to achieve a particularly high conductivity with simultaneously low process outlay, because the metallic material can be fashioned over a larger distance of the electrical contacting.

Due to the fact that a first insulator is situated in the first configuration of recesses, according to a specific embodiment of the present invention it is advantageously possible to achieve a high-quality insulation between the contacting region (and thus the electrical contacting itself) and the rest of the cover layer. At the same time, in this way, a spatial separation between a TSV insulation and a metal can be achieved, because the first insulator is not situated in the opening. In this way, later etching steps in the floor region of the opening can, particularly advantageously, be omitted.

Due to the fact that in a first contact region a direct contact is formed between the conductor layer and the cover layer, the first contact region surrounding the opening at least partly, preferably completely, according to a specific embodiment of the present invention it is possible that a first contact region is formed that is completely surrounded by the first configuration of recesses. In this way, a high-quality insulation can be achieved between the electrical contacting and the rest of the cover layer, and at the same time the opening can easily be formed (and filled with metallic material) both in the contacting region and in the conductor region.

Due to the fact that the contacting region surrounds the opening around its full circumference, an advantageous spatial separation can be made between the first configuration of recesses (in the cover layer) and the first insulator situated therein and the metallic material of the electrical via. The contacting region surrounds the opening preferably around its full circumference, over the entire extension of the cover layer (perpendicular to the substrate surface/chip surface).

Due to the fact that the metallic material is situated on a lateral wall of the opening in the conductor region, the metallic material being situated in particular on a further lateral wall of the opening in the contacting region, according to a specific embodiment of the present invention it is possible to achieve a large-surface direct contact between the conductor region and the metallic material. A large contact surface can particularly advantageously reduce the overall resistance of the system. In addition, in this way it is possible to bring it about that the doping distribution in the vertical direction inside the conductor layer/conductor region does not play a role, and an optimal contacting can be achieved over the entire height of the conductor region. In contrast, if there is a direct contact between the metallic material and the conductor region only on the upper side of the conductor region (i.e., without the situation of the metallic material on a lateral wall of the opening in the conductor region), these advantages cannot be achieved.

Due to the fact that in addition the opening is formed in an additional region of a silicon layer of the SOI wafer or SOI chip, the metallic material further being situated in the opening in the additional region, according to a specific embodiment of the present invention it is possible for the metallic material to extend over the contacting region (of the cover layer) and the conductor region (of the conductor layer), into the additional region of the silicon layer of the SOI wafer or SOI chip; in this way, a particularly low electrical resistance can be achieved.

According to a specific embodiment of the present invention, it is preferred that the opening is formed at least essentially perpendicular to the wafer surface or chip surface.

According to specific embodiments of the present invention, it is possible that the cover layer and/or the conductor layer include (doped) silicon.

According to specific embodiments of the present invention, it is possible that an electromechanical part/system is formed in the SOI wafer or SOI chip. In particular, it is provided that the conductor region is connected to a component of the electromechanical part, and in this way an electrically conductive connection is formed between the surrounding wiring and the component of the electromechanical part.

According to a specific embodiment of the present invention, it is possible that the conductor region, or the strip conductor, is made as broad as possible, in order to keep the resistance low in the strip conductor. In particular, it is possible to design the strip conductor/the conductor region to be significantly broader than the typical TSV diameter (in particular the diameter of the metallic material in the opening) and its associated contact surfaces. This holds in particular for tungsten TSVs, which are preferably to be sealed during the tungsten deposition itself.

A further embodiment of the present invention is a method for producing an electrical contacting according to a specific embodiment of the present invention. In accordance with an example embodiment of the present invention, the method includes the following steps:
  in a first step, the cover layer is structured in such a way that a contacting region is formed that is insulated from the rest of the cover layer by a first configuration of recesses,
  in a second step, the opening is formed at least in the contacting region,
  in a third step, a metallic material is situated in the opening, the metallic material connecting the surrounding wiring and the conductor region.

According to a specific embodiment of the present invention, it is possible that in the first step the cover layer is further structured, in addition to the formation of the first configuration of recesses, for example in order to create trenches that make it possible—following the first step—to carry out an etching step in which parts of the second insulator, of the second insulating layer, of the third insulator, and of the third insulating layer are etched away in order to expose a microelectromechanical part.

Due to the fact that in the second step the opening is further made in the conductor region, and in the third step the metallic material is in addition situated in the opening in the conductor region, according to a specific embodiment of the present invention it is possible to achieve a particularly high conductivity with, at the same time, a low process outlay. Preferably, it is provided that the opening extends (substantially) perpendicular to the surface of the wafer/chip, and that the metallic material forms an uninterrupted connection between the conductor region and the surrounding wiring.

Due to the fact that in the first step the cover layer is formed in a first contact region, and in the first contact region a direct contact is formed between the conductor layer and the cover layer, the cover layer in particular being further situated on the second insulating layer, according to a specific embodiment of the present invention it is possible to form a first contact region adjoining the later contacting region, in which first contact region the cover layer and the conductor layer have a (direct) contact surface. Correspondingly, it is possible to form the opening later in the process both in the contacting region of the cover layer and also in the conductor region (situated at least partly under the cover layer and adjoining it) of the conductor layer.

Due to the fact that in a first intermediate step, after the first step and before the second step, a first insulator is situated in the first configuration of recesses, a first insulating layer further being situated on the cover layer, the first insulating layer preferably being removed in a third contact region, in particular at the contacting region, in a second intermediate step after the first intermediate step and before the second step, according to a specific embodiment of the present invention it is possible for a high-quality insulation to be formed between the contacting region and the rest of the cover layer. Preferably, the first insulating layer and the first insulator are applied simultaneously (or in one step). Particularly preferably, the first insulator and the first insulating layer are made of the same dielectric.

Due to the fact that in the third step the surrounding wiring, in particular metallic surrounding wiring, is situated on the first insulating layer, according to a specific embodiment of the present invention it is possible to form an electrical contact between the surrounding wiring and the cover layer only in the contacting region, or on the metallic material.

Due to the fact that
  in a first pre-step, a structure is formed in a silicon layer of an SOI wafer or SOI chip,
  in a second pre-step, after the first pre-step, a third insulator is situated at least partly in the structure, and a third insulating layer is situated above the silicon layer,
  in a third pre-step, after the second pre-step, the third insulating layer is removed in a second contact region,
  in a fourth pre-step, after the third pre-step, the conductor layer is situated on the third insulating layer, and in particular in the second contact region a direct contact is formed between the conductor layer and the silicon layer, the conductor layer being structured in such a way that the conductor region is formed, which is insulated from a further conductor region of the conductor layer by a second configuration of recesses, in a fifth pre-step, after the fourth pre-step, a second insulating layer is situated on the conductor layer, a second insulator being situated in the second configuration of recesses, in a sixth pre-step, after the fifth pre-step and before the first step, the second insulating layer being removed in a first contact region, in particular at the conductor region, according to a specific embodiment of the present invention it is possible to provide a particularly efficient exemplary process by which a microelectromechanical part is formed and can be contacted in a particularly efficient and cost-saving manner.

According to a specific embodiment of the present invention, it is preferably possible that an etching step is carried out between the first step and the first intermediate step. In this etching step, parts of the second insulator, of the second insulating layer, of the third insulator, and/or of the third insulating layer can be etched away. In particular, it is possible in this way for an insulating material (sacrificial oxide) around the microelectromechanical element to be removed, thus exposing the microelectromechanical part.

In order to particularly efficiently prevent an increase of the resistance at the narrow transition regions between highly conductive but possibly narrow metal regions and the silicon regions, according to a specific embodiment of the present invention it is advantageously possible to select the first contact surface (first contact region) between the conductor region/strip conductor and the contacting region of the cover layer to be larger than the opening into which the metallic material is introduced. In this way, the effective silicon thickness in the transition region between the narrow TSV and the broad silicon strip conductor can be increased, and the resistance can locally be reduced there. Alternatively or in addition, it is possible to additionally provide an (insulated) additional region of the SOI layer under the conductor region, and to connect this additional region to a second contact region to the silicon strip conductor. In this way, it is possible in the second step (trench step) to also etch into the SOI material (in the additional region). Accordingly, the SOI layer can be used to locally reduce the resistance of the silicon strip conductor.

A further subject matter of the present invention is a system including an electrical contacting according to one of the specific embodiments of the present invention for contacting a part, in particular a sensor. The part is in particular a microelectromechanical part that is fashioned at least substantially in the SOI wafer or SOI chip.

For the system according to the present invention including an electrical contacting according to one of the specific embodiments of the present invention for contacting a part, as well as the method according to the present invention for producing an electrical contacting, the features, embodiments, and advantages may be used that have been described in connection with the electrical contacting according to the present invention or a specific embodiment of the electrical contacting according to the present invention.

For the electrical contacting according to the present invention, the features, embodiments, and advantages may be used that have been described in connection with the method according to the present invention for producing an electrical contacting, the system according to the present invention including an electrical contacting, a specific embodiment of the method according to the present invention for producing an electrical contacting or a specific embodiment of the system including an electrical contacting.

Exemplary embodiments of the present invention are shown in the figures and are explained in more detail in the following description.

BRIEF DESCRIPTION OF THE DRAWINGS

FIG. 6 shows a schematic representation of a method for producing an electrical contacting according to a specific embodiment of the present invention after a second step.

FIG. 7 shows a schematic representation of a method for producing an electrical contacting according to a specific embodiment of the present invention after a third step.

FIG. 8 shows a schematic representation of a system including an electrical contacting for contacting a part according to a further specific embodiment of the present invention.

DETAILED DESCRIPTION OF EXAMPLE EMBODIMENTS

Figure 1:
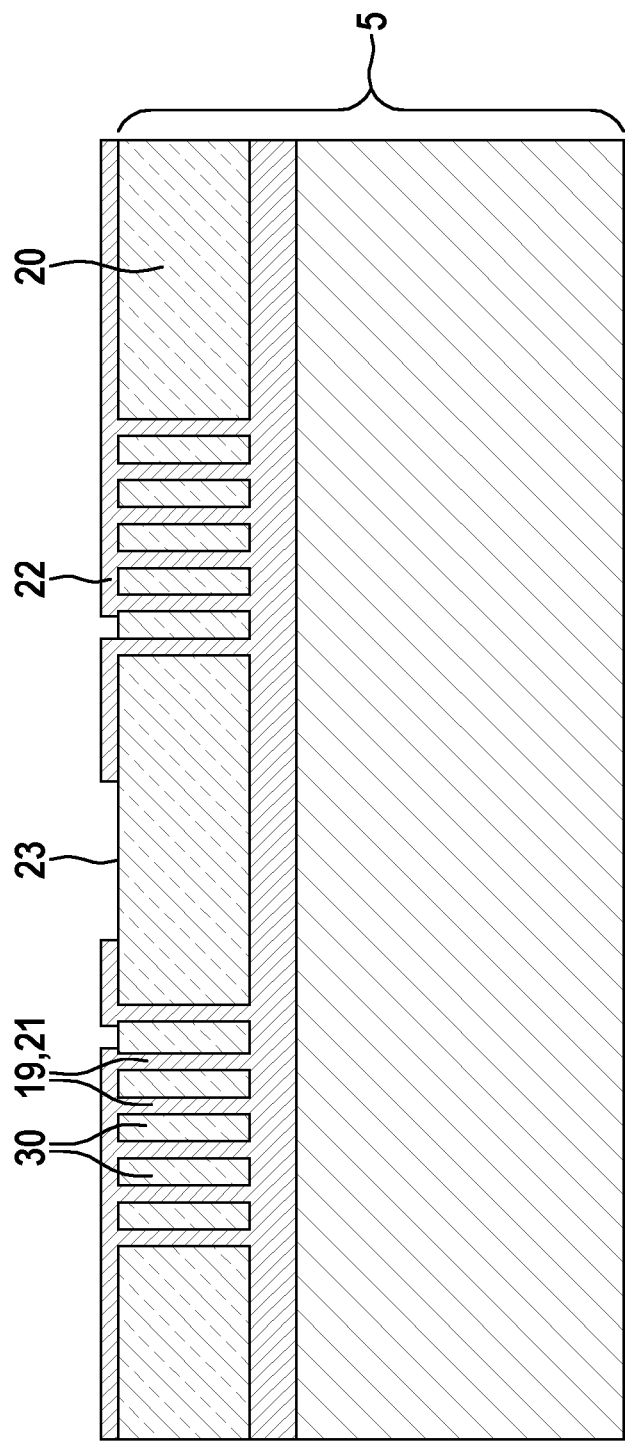
FIG. 1 shows a schematic representation of a method for producing an electrical contacting according to a specific embodiment of the present invention after a third pre-step.

In the various Figures, identical parts are provided with the same reference characters, and are therefore generally named or mentioned only once.

FIG. 1 shows a schematic representation of a method for producing an electrical contacting 1 according to a specific example embodiment of the present invention after a third pre-step. Before the second pre-step, a structure 19 was produced in a silicon layer 20 of an SOI wafer 5 or SOI chip 5 (trenching). Using structure 19, the individual components of a microelectromechanical part 30 are defined. In a second pre-step, a third insulator 21 was then deposited in structure 19, and at the same time a third insulating layer 22 was formed above silicon layer 20. Third insulating layer 22 and third insulator 21 are correspondingly preferably made of the same oxide. In the third pre-step, insulating layer 22 was then removed in a second contact region 23.

Figure 2:
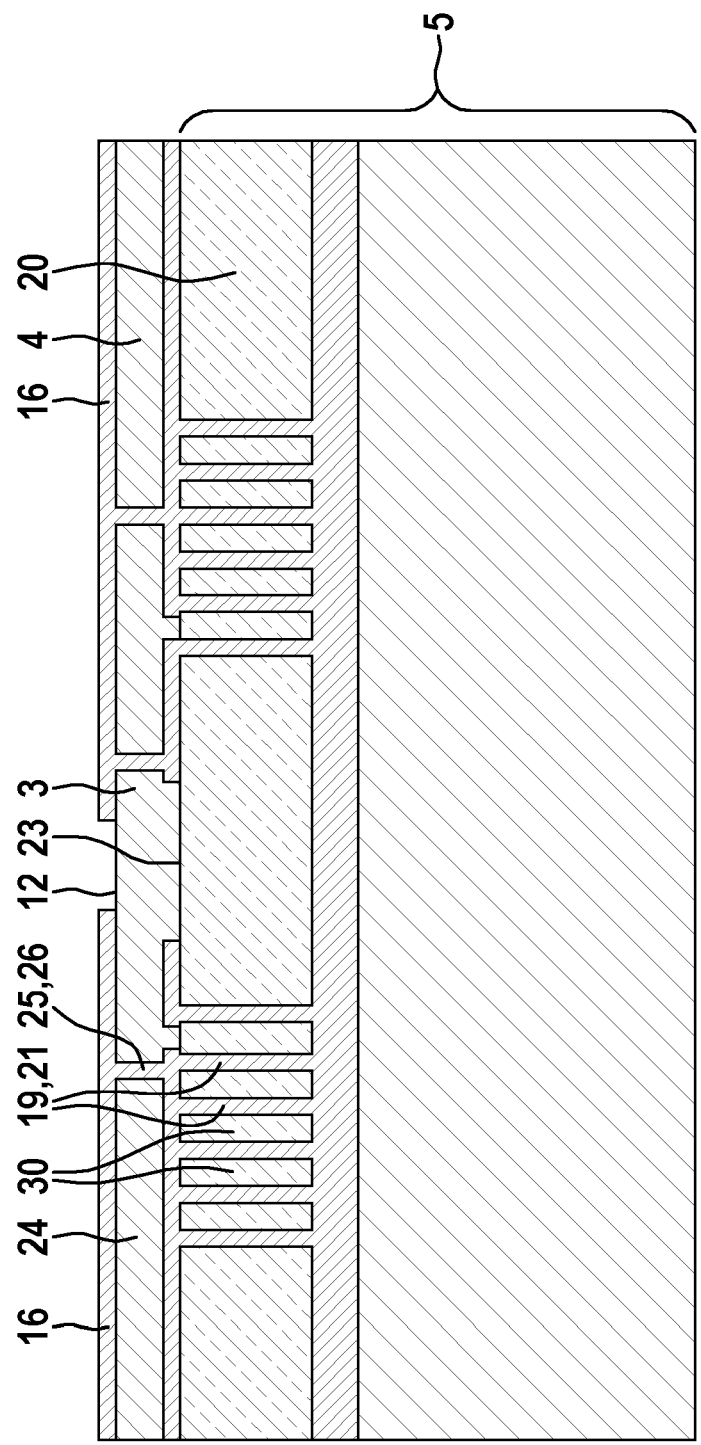
FIG. 2 shows a schematic representation of a method for producing an electrical contacting according to a specific embodiment of the present invention after a sixth pre-step.

FIG. 2 shows a schematic representation of a method for producing an electrical contacting 1 according to a specific embodiments of the present invention after a sixth pre-step. In a fourth pre-step, a conductor layer 4 was previously applied on third insulating layer 22. Here, a direct contact was formed in second contact region 23 between conductor layer 4 and silicon layer 20. Conductor layer 4 was structured in such a way that a conductor region 3 was formed that is separated from a further conductor region 24 of conductor layer 4 by a second configuration of recesses 25. Further structurings of conductor layer 4 can also be carried out at the same time. In a fifth pre-step, a second insulating layer 16 was then applied on conductor layer 4. Here, a second insulator 26 was situated in second configuration of recesses 25. Second insulator 26 thus produces an electrical insulation between conductor region 3 and further conductor region 4. Finally, in the sixth pre-step, second insulating layer 16 is removed in a first contact region 12, adjacent to conductor region 3. The first contact region here advantageously overlaps partly or completely with an opening 9 that is formed later (see FIG. 6).

Figure 3:
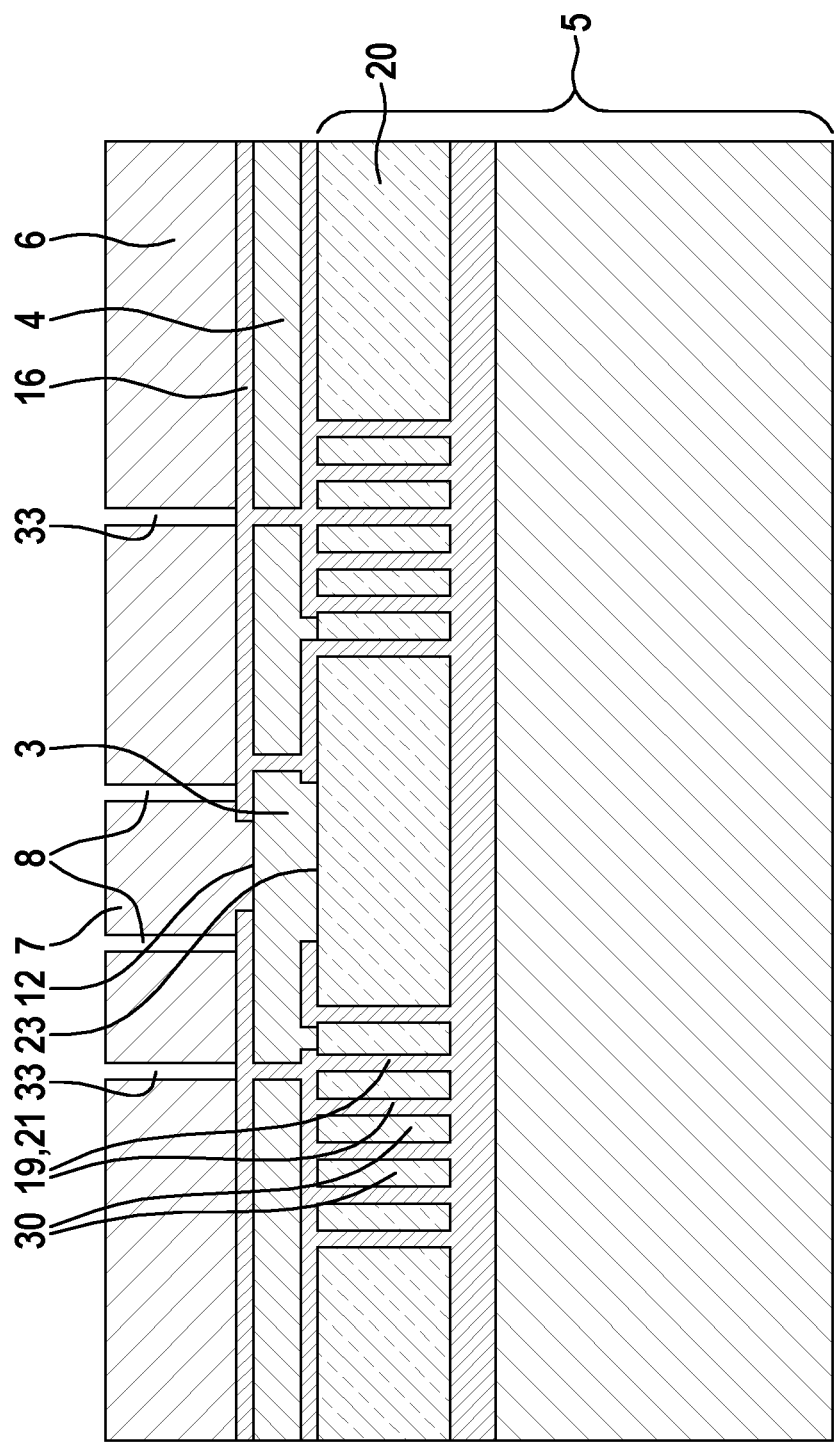
FIG. 3 shows a schematic representation of a method for producing an electrical contacting according to a specific embodiment of the present invention after a first step.

FIG. 3 shows a schematic representation of a method for producing an electrical contacting 1 according to a specific embodiment of the present invention after a first step. In the first step, a cover layer 6 was formed in first contact region 12, so that a direct contact is produced in first contact region 12 between conductor layer 4 and cover layer 6. In addition, cover layer 6 was applied on second insulating layer 16. Subsequently, cover layer 6 was structured in such a way that a contacting region 7 is formed that is insulated from the rest of cover layer 6 by a first configuration of recesses 8 (a trench). At the same time, further etched structurings 33 were made in cover layer 6, via which the underlying sacrificial oxide can later be etched out in an etching step in order to expose part 30. Due to the fact that the formation of first configuration of recesses 8 can take place in a common step together with the formation of etched structurings 33, a particularly cost-efficient process results.

Figure 4:
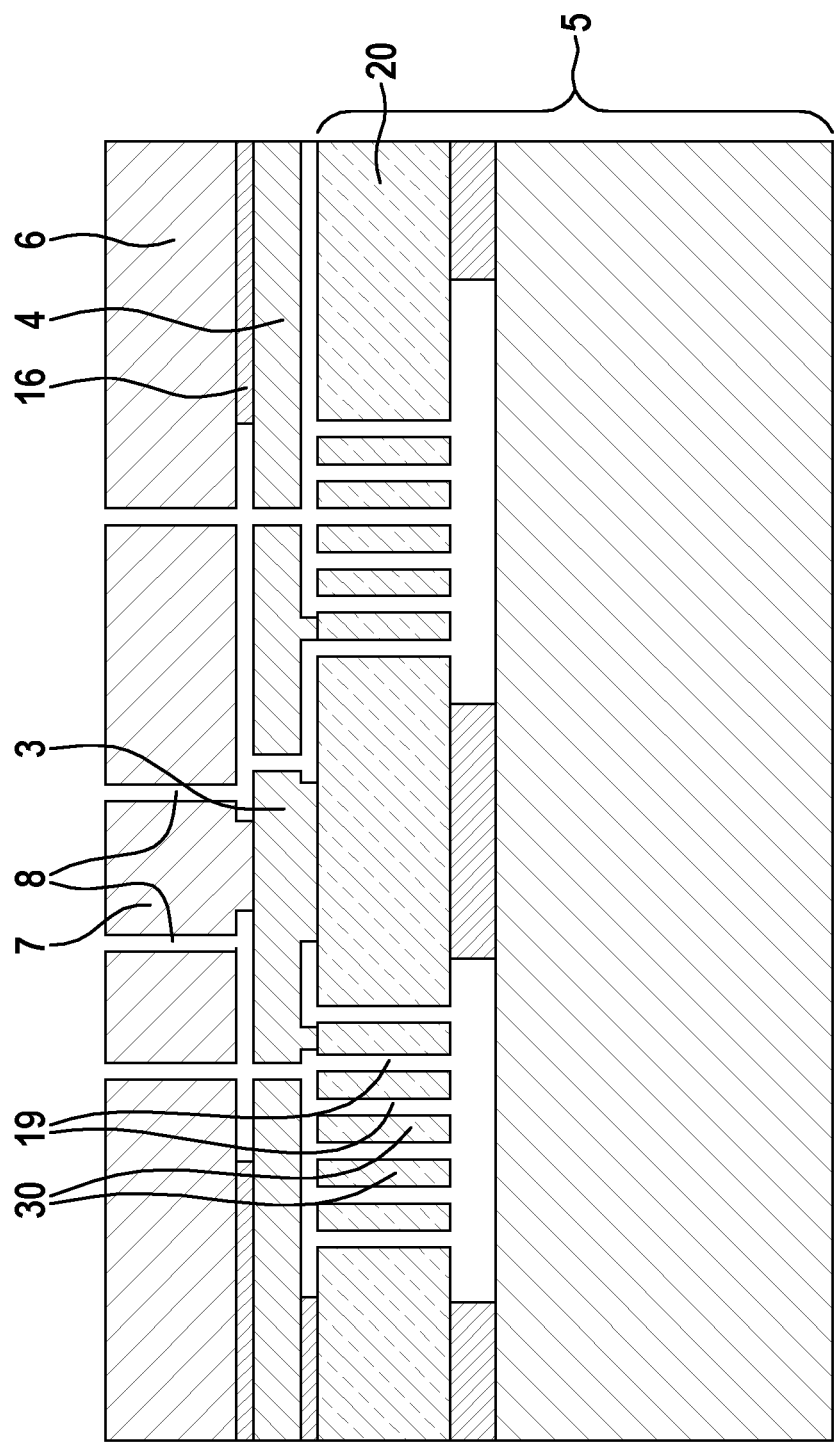
FIG. 4 shows a schematic representation of a method for producing an electrical contacting according to a specific embodiment of the present invention after a first step and after an etching step.

FIG. 4 shows a schematic representation of a method for producing an electrical contacting 1 according to a specific embodiment of the present invention, after a first step and after the etching step. In this etching step, between the first step and the first intermediate step, parts of second insulator 26, of second insulating layer 16, of third insulator 21, and of third insulating layer 22 were etched out via etching structurings 33 (and first configuration of recesses 8). Microelectromechanical element 30 was exposed by the removal of this sacrificial oxide.

Figure 5:
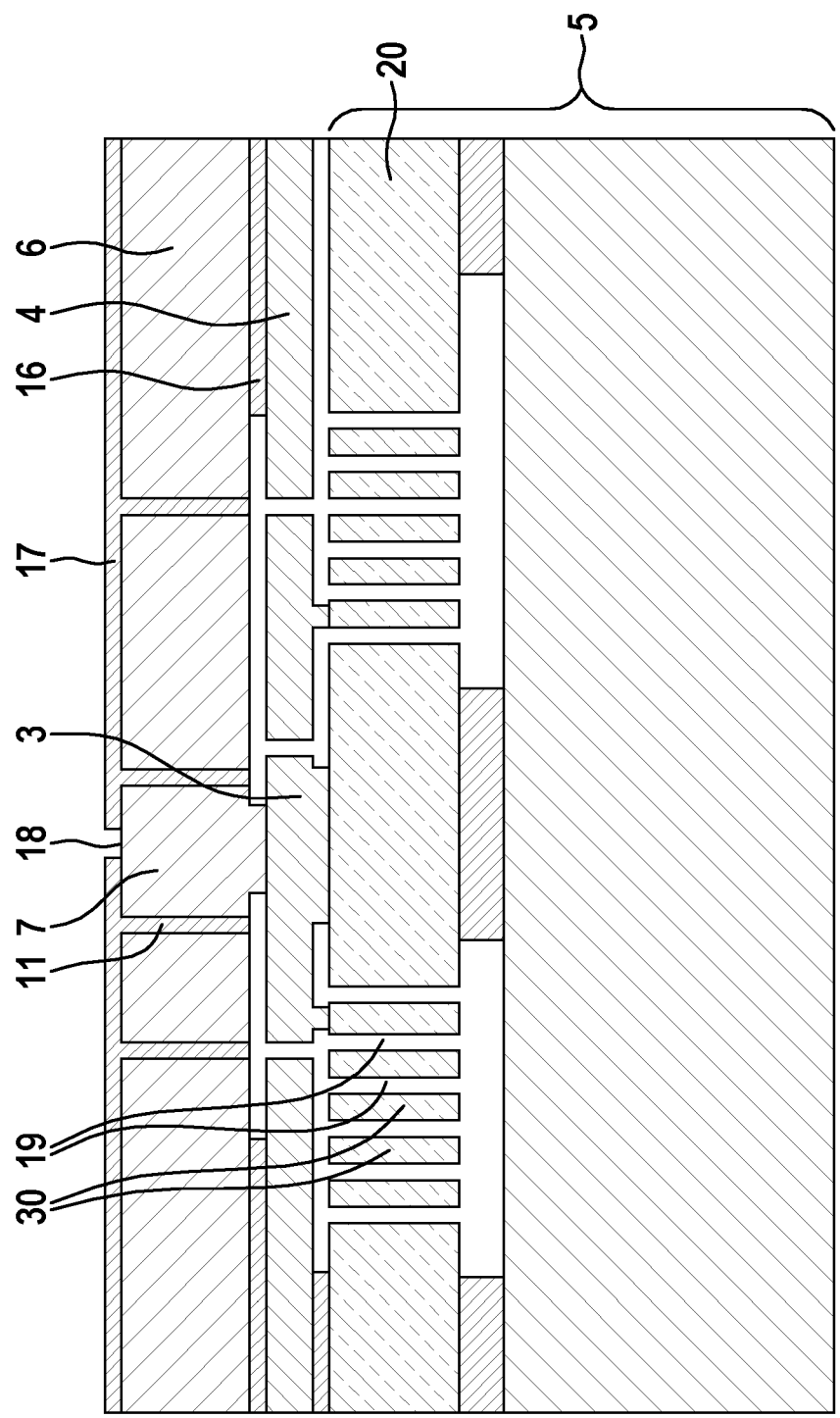
FIG. 5 shows a schematic representation of a method for producing an electrical contacting according to a specific embodiment of the present invention after a second intermediate step.

FIG. 5 shows a schematic representation of a method for producing an electrical contacting 1 according to a specific embodiment of the present invention after a second intermediate step. In a first intermediate step, before the second intermediate step, a first insulator 11 (or a dielectric) was situated in first configuration of recesses 8 (and in the etched structurings 33). As a result, part 30 (including for example a resonator) is sealed. Advantageously, the sealing of part 30 and the filling of configuration of recesses 8 with first insulator 18 can thus take place simultaneously, so that there results almost no additional outlay in the electrical installation of electrical contacting 1 (because part 30 typically has to be sealed anyway). At the same time, a first insulating layer 17 was applied on cover layer 6. In the second intermediate step, first insulating layer 17 was removed in a third contact region 18 adjoining contacting region 7.

FIG. 6 shows a schematic representation of a method for producing an electrical contacting 1 according to a specific embodiment of the present invention after a second step. In a second step, an opening 9 was formed in contacting region 7, in conductor region 3, and in an additional region 15 (silicon layer 20). Here, opening 9 was etched into regions 7, 3, 15 in a common step, and extends substantially perpendicular to a surface (or perpendicular to a main plane of extension) of the wafer/chip. Opening 9 is situated such that within cover layer 6 it is completely surrounded by contacting region 7, and within conductor layer 4 it is completely surrounded by conductor region 3.

FIG. 7 shows a schematic representation of a method for producing an electrical contacting 1 according to a specific embodiment of the present invention after a third step, and thus shows a finished system 40 including a MEMS part 30 and electrical contacting 1. In the third step, a metallic material 10 was introduced into opening 9 (in contacting region 7, conductor region 3, and additional region 15). Metallic material 10 was here situated on a lateral wall 13 of opening 9 in conductor region 3 and on a further lateral wall 14 of opening 9 in contacting region 7. This results in a large contact surface between metallic material 10 and conductor region 3 (or between metallic material 10 and contacting region 7), which has a particularly advantageous effect on the minimization of the electrical resistance at the transition between metallic material 10 and conductor region 3.

Particularly advantageously, according to the present invention an additional application of an insulating layer in opening 9 (before the filling with metallic material 10, i.e., before the third step), and a local removal (on the floor of the opening) of such an insulating layer can be omitted, because contacting region 7 was already previously insulated from the rest of cover layer 6, and conductor region 3 was already previously insulated from the rest of conductor layer 4.

In addition, in the third step surrounding wiring 2 was applied at the same time, which is correspondingly made of the same material as metallic material 10. Metallic material 10 is configured in such a way that it produces an electrically conductive connection having low resistance between surrounding wiring 10 and conductor region 3, as well as additional region 15. In addition, conductor region 3 is connected to a component of MEMS part 30. Overall, an electrical connection that has a very low resistance is thus formed between surrounding wiring 2 and the component of MEMS part 30.

FIG. 8 shows a schematic representation of a system 40 including an electrical contacting 1 for contacting a part 30 according to a further specific example embodiment of the present invention. Differing from the specific example embodiment shown in FIG. 7, opening 9 is situated only in contacting region 7 and conductor region 3, but not in silicon layer 20 of SOI wafer 5 (or, not in additional region 15). This is advantageously achieved in that third insulating layer 22 below later opening 9 is not removed, i.e. no third pre-step is carried out and no second contact region 23 is formed. Correspondingly, it is possible in the etching step after the first step to leave oxide, or material of third insulating layer 22, below conductor region 3. In this way, in the second step opening 9 can be formed only in contacting region 7 and conductor region 3, and can be downwardly bounded by third insulating layer 22. Correspondingly, metallic material 10 in opening 9 is formed only in contacting region 7 and in conductor region 3.

What is claimed is:

1. An electrical contacting between a surrounding wiring and a conductor region, the conductor region being situated in a conductor layer above an SOI wafer or SOI chip, a cover layer being situated above the conductor layer and below the surrounding wiring, the cover layer having a contacting region, the contacting region being insulated from the rest of the cover layer by a first configuration of recesses, an opening is formed at least in the contacting region, a metallic material is situated in the opening, and the metallic material connects the surrounding wiring and the conductor region, wherein the conductor region is separated from a further conductor region by a second configuration of recesses, wherein the conductor region is insulated from the further conductor region by the second configuration of recesses.

2. The electrical contacting as recited in claim 1, wherein the opening is also fashioned in the conductor region, and the metallic material is further situated in the opening in the conductor region.

3. The electrical contacting as recited in claim 1, wherein a first insulator is situated in the first configuration of recesses.

4. The electrical contacting as recited in claim 1, wherein a direct contact is formed, in a first contact region between the conductor layer and the cover layer, the first contact region surrounds the opening at least partly.

5. The electrical contacting as recited in claim 1, wherein a direct contact is formed, in a first contact region between the conductor layer and the cover layer, the first contact region surrounds the opening completely.

6. The electrical contacting as recited in claim 1, wherein the contacting region surrounds the opening around its entire circumference.

7. The electrical contacting as recited in claim 1, wherein the metallic material is situated on a lateral wall of the opening in the conductor region, the metallic material being situated on a further lateral wall of the opening in the contacting region.

8. The electrical contacting as recited in claim 1, wherein the opening is further formed in an additional region of a silicon layer of the SOI wafer or SOI chip, the metallic material further being situated in the opening in the additional region.

9. A method for producing an electrical contacting between a surrounding wiring and a conductor region, the conductor region being situated in a conductor layer above an SOI wafer or SOI chip, a cover layer being situated above the conductor layer and below the surrounding wiring, the method comprising:
   in a first step, structuring the cover layer in such a way that a contacting region is formed that is insulated from the rest of the cover layer by a first configuration of recesses;
   in a second step, forming an opening at least in the contacting region; and
   in a third step, situating a metallic material in the opening, the metallic material connecting the surrounding wiring and the conductor region,
   wherein the conductor region is separated from a further conductor region by a second configuration of recesses, wherein the conductor region is insulated from the further conductor region by the second configuration of recesses.

10. The method as recited in claim 9, wherein the opening is further formed in the conductor region in the second step, the metallic material further being situated in the opening in the conductor region in the third step.

11. The method as recited in claim 9, wherein the cover layer is formed in a first contact region in the first step, a direct contact being formed in the first contact region between the conductor layer and the cover layer, the cover layer further being situated on a second insulating layer.

12. The method as recited in claim 11, wherein a first insulator is situated in the first configuration of recesses in a first intermediate step, after the first step and before the second step, and wherein a first insulating layer is situated on the cover layer, and the first insulating layer being removed in a second intermediate step after the first intermediate step and before the second step, in a third contact region at the contacting region.

13. The method as recited in claim 9, wherein the surrounding wiring is a metallic surrounding wiring, and is situated on the first insulating layer in the third step.

14. The method as recited in claim 9, wherein:
   in a first pre-step, a structure is formed in a silicon layer of an SOI wafer or SOI chip;
   in a second pre-step, after the first pre-step, a third insulator is situated at least partly in the structure, and a third insulating layer is situated above the silicon layer;
   in a third pre-step, after the second pre-step, the third insulating layer is removed in a second contact region;
   in a fourth pre-step, after the third pre-step, the conductor layer is situated on the third insulating layer, and in the second contact region, a direct contact is formed between the conductor layer and the silicon layer, the conductor layer being structured in such a way that the conductor region is formed, which is insulated from the further conductor region of the conductor layer by the second configuration of recesses;
   in a fifth pre-step, after the fourth pre-step, a second insulating layer is situated on the conductor layer, a second insulator being situated in the second configuration of recesses; and
   in a sixth pre-step, after the fifth pre-step and before the first step, the second insulating layer is removed in a first contact region at the conductor region.

15. A system, comprising:
   an electrical contacting between a surrounding wiring and a conductor region, the conductor region being situated in a conductor layer above an SOI wafer or SOI chip, a cover layer being situated above the conductor layer and below the surrounding wiring, the cover layer having a contacting region, the contacting region being insulated from the rest of the cover layer by a first configuration of recesses, an opening is formed at least in the contacting region, a metallic material is situated in the opening, and the metallic material connects the surrounding wiring and the conductor region;
   wherein the electrical contacting is configured for contacting a sensor,
   wherein the conductor region is separated from a further conductor region by a second configuration of recesses, wherein the conductor region is insulated from the further conductor region by the second configuration of recesses.

\* \* \* \* \*